US010734824B2

(12) United States Patent
Innes et al.

(10) Patent No.: US 10,734,824 B2
(45) Date of Patent: *Aug. 4, 2020

(54) FLEXIBLE BATTERY

(71) Applicant: AT&T Intellectual Property I, L.P., Atlanta, GA (US)

(72) Inventors: Timothy Innes, Atlanta, GA (US); David Spivey, Jr., Smyrna, GA (US); Kevin Igoe, Atlanta, GA (US)

(73) Assignee: AT&T Intellectual Property I, L.P., Atlanta, GA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/429,398

(22) Filed: Jun. 3, 2019

(65) Prior Publication Data

US 2019/0296566 A1 Sep. 26, 2019

Related U.S. Application Data

(63) Continuation of application No. 15/433,403, filed on Feb. 15, 2017, now Pat. No. 10,312,705.

(51) Int. Cl.
*H02N 2/18* (2006.01)
*H01L 41/18* (2006.01)
*H02J 7/00* (2006.01)
*H01L 37/02* (2006.01)
*H02J 7/34* (2006.01)

(52) U.S. Cl.
CPC ............ *H02J 7/0042* (2013.01); *H01L 37/02* (2013.01); *H01L 41/18* (2013.01); *H02N 2/18* (2013.01); *H02J 7/345* (2013.01)

(58) Field of Classification Search
CPC ............................. H01L 35/325; H02J 7/0042

USPC ........................................................ 320/166
See application file for complete search history.

(56) References Cited

U.S. PATENT DOCUMENTS

| 8,179,026 | B2 | 5/2012 | Russell et al. |
| 8,519,595 | B2 | 8/2013 | Hunter et al. |
| 8,674,588 | B2 | 3/2014 | Kurihara et al. |
| 8,803,406 | B2 | 8/2014 | Lee et al. |

(Continued)

FOREIGN PATENT DOCUMENTS

KR    20120088599    8/2012

OTHER PUBLICATIONS

"Pyroelectric microtubes could have a wide range of biological applications such as miniature implantable sensors," Innovation Toronto, retrieved at http://www.innovationtoronto.com/2016/10/pyroelectric-microtubes-could-have-a-wide-range-of-biological-applications-such-as-miniature-implantable-sensors/ on Jan. 31, 2017.

(Continued)

*Primary Examiner* — Edward Tso
*Assistant Examiner* — Ahmed H Omar
(74) *Attorney, Agent, or Firm* — Hartman & Citrin LLC (57) ABSTRACT

Concepts and technologies are disclosed herein for flexible batteries and methods for forming flexible batteries. A flexible battery can include a borophene sheet, a pyroelectric peptide microtubule, and a borophene cap. A first end of the pyroelectric peptide microtubule can be located adjacent to the borophene sheet and the borophene cap can be located at a second end of the pyroelectric peptide microtubule. The borophene cap can collect a charge created by the pyroelectric peptide microtubule. The flexible battery also can include a collection wire that directs the charge to a borophene capacitor charge system.

20 Claims, 6 Drawing Sheets

(56) References Cited

U.S. PATENT DOCUMENTS

| | | | |
|---|---|---|---|
| 9,112,432 | B2 | 8/2015 | Park et al. |
| 9,406,864 | B2 | 8/2016 | Kim et al. |
| 9,422,925 | B2 | 8/2016 | Madani |
| 2012/0133210 | A1 | 5/2012 | Moon et al. |
| 2012/0288762 | A1 | 11/2012 | Hardin et al. |
| 2014/0174496 | A1 | 6/2014 | Park et al. |
| 2015/0263377 | A1 | 9/2015 | Brooks et al. |
| 2016/0233792 | A1 | 8/2016 | Park et al. |

OTHER PUBLICATIONS

Esin et al., Abstract for "Pyroelectric effect and polarization instability in self-assembled diphenylalanine microtubes," Applied Physics Letters, Oct. 2016, vol. 109, Issue 14.

"Pyroelectric Peptide Microtubes Turn Heat to Electric Currents," Newswise, Inc., Sep. 30, 2016.

"Pyroelectric peptide microtubes turn heat to electric currents," Phys.org, Oct. 5, 2016.

Zhang et al., Abstract for "Substrate-Induced Nanoscale Undulations of Borophene on Silver," Nano Letters, Sep. 22, 2016.

"Researchers say 2-D boron may be best for flexible electronics," Phys.org, Oct. 4, 2016.

Williams, Mike, "Long may you wave, borophene," Rice University News & Media, Oct. 4, 2016.

Curry, David, "Is super-thin borophene the future of wearables?," ReadWrite, Oct. 7, 2016.

Berger, Michael, "Light-driven bioelectronic implants without batteries," Nanowerk, Nov. 6, 2015.

Butler et al., "Progress, Challenges, and Opportunities in Two-Dimensional Materials Beyond Graphene," ACS Nano, vol. 7, No. 4, pp. 2898-2926.

Lorenz et al., "Is $MoS_2$ a robust material for 2D electronics?," Nanotechnology, Nov. 7, 2014, vol. 25, No. 44, PubMed.gov.

Schwierz, Frank, 2D Materials Beyond Graphene for Future Electronics, PowerPoint Presentation, Apr. 15, 2015, Frontiers of Characterization and Metrology for Nanoelectronics FCMN, Ilmenau University of Technology.

"Two dimensional semiconductor," Wikipedia, retrieved at https://en.wikipedia.org/wiki/Two_dimensional_semiconductor on Dec. 13, 2016.

Peplow, Mark, "Atom-thin 'borophene' joins 2D materials club," Nature International Weekly Journal of Science, Dec. 17, 2015, Springer Nature.

Peng et al., Abstract for "The electronic, optical and thermodynamic properties of borophene from first-principles calculations," Journal of Materials Chemistry C, Issue 16, Apr. 8, 2016.

Dillon, A.C., Abstract for "Carbon Nanotubes for Photoconversion and Electrical Energy Storage," Chemical Reviews, Sep. 14, 2010, pp. 6856-6872, American Chemical Society.

U.S. Notice of Allowance dated Jan. 2, 2019 in U.S. Appl. No. 15/433,403.

FLEXIBLE BATTERY

CROSS-REFERENCE TO RELATED APPLICATIONS

This application is a continuation of and claims priority to U.S. patent application Ser. No. 15/433,403, entitled "Flexible Battery," filed Feb. 15, 2017, now U.S. Pat. No. 10,312,705 which is incorporated herein by reference in its entirety.

BACKGROUND

As the ubiquitous nature of powered devices continues to proliferate (e.g., as the Internet of Things powers new and innovative devices in various environments), power supply needs continue to diversify. Whereas until the last few decades a power cord was an acceptable power supply, the need and desire for new wireless power supplies continues to evolve. As new devices begin to operate in new environments, power needs may continue to evolve.

In particular, wearable and implantable devices pose interesting power challenges. In the case of an implantable device in particular, access to the device may be limited, and chemical leakage from chemical batteries may be unsafe or at least unacceptable. Furthermore, with the scale of devices being reduced frequently, power supply challenges are compounded at least because batteries of reduced scale typically have a shorter life than larger-scale counterparts.

SUMMARY

The present disclosure is directed to a flexible battery. The flexible batteries illustrated and described herein can be "dry" and flexible. As used herein with reference to batteries, a "dry" battery can correspond to a battery that does not use chemicals to drive a difference in voltage (e.g., chemicals are not used to produce a current). As used herein, the word "flexible" and variants thereof, when used to describe a battery or component thereof, refers to an ability bend, stretch, twist, compress, or otherwise flex a material and/or a battery. Embodiments of the flexible battery illustrated and described herein is flexible and dry. Furthermore, embodiments of the flexible battery illustrated and described herein are self-charging and therefore do not require input of electrical current and/or charging.

According to various embodiments, a flexible battery can be formed from a borophene sheet, a pyroelectric peptide microtubule attached to the borophene sheet, a borophene cap, a collection wire, and a borophene capacitor charge system. Heat and/or movement at or near the borophene sheet can be converted by the pyroelectric peptide microtubule into a current. The current can be collected by the borophene cap and channeled or directed by the collection wire to a borophene capacitor charge system. The borophene capacitor charge system can include one or more borophene capacitors, each of which can include two borophene plates separated by a layer of insulating material. Charge from the borophene capacitor charge system can be output to a switch or device. The flexible batteries can include one or more cells, and the flexible batteries can be located within a housing, in some embodiments. Additional aspects of the concepts and technologies disclosed herein will be illustrated and described in more detail below.

According to one aspect of the concepts and technologies disclosed herein, a flexible battery is disclosed. The flexible battery can include a borophene sheet. The flexible battery also can include a pyroelectric peptide microtubule. A first end of the pyroelectric peptide microtubule can be located adjacent to the borophene sheet. The flexible battery also can include a borophene cap that can be located at a second end of the pyroelectric peptide microtubule. The borophene cap can collect a charge that is created by the pyroelectric peptide microtubule. The flexible battery also can include a collection wire that can be located at the second end of the pyroelectric peptide microtubule. The collection wire can direct the charge to a borophene capacitor charge system.

In some embodiments, the pyroelectric peptide microtubule can be attached to the borophene sheet. In some embodiments, the flexible battery also can include an elastic sheet. The borophene sheet can be attached to the elastic sheet. In some embodiments, movement of the elastic sheet can provide mechanical energy that can be converted to a current by the pyroelectric peptide microtubule. In some embodiments, heat energy at (or that passes through) the borophene sheet can be converted to a current by the pyroelectric peptide microtubule. In some embodiments, the borophene capacitor charge system can include a borophene capacitor. In some embodiments, the borophene capacitor can include a first borophene plate; a second borophene plate; and a layer of insulating material. The layer of insulating material can be located between the first borophene plate and the second borophene plate. In some embodiments, the borophene capacitor further can include an output.

In some embodiments, the flexible battery also can include another pyroelectric peptide microtubule. A first end of the other pyroelectric peptide microtubule can be located adjacent to the borophene sheet. The flexible battery also can include another borophene cap. The other borophene cap can be located at a second end of the other pyroelectric peptide microtubule. The other borophene cap can collect another charge that can be created by the other pyroelectric peptide microtubule. The flexible battery also can include another collection wire that can be located at the second end of the further pyroelectric peptide microtubule. The other collection wire can direct the further charge to the borophene capacitor charge system. In some embodiments, the flexible battery also can include an insulating ring that can be located at the second end of the pyroelectric peptide microtubule. In some embodiments, the flexible battery also can include a flexible structural housing. The flexible structural housing can have multiple borophene patches, a negative terminal, and a positive terminal.

According to another aspect of the concepts and technologies disclosed herein, another flexible battery is disclosed. The flexible battery can include a borophene sheet and an elastic sheet attached to the borophene sheet. The flexible battery also can include a pyroelectric peptide microtubule. A first end of the pyroelectric peptide microtubule can be located adjacent to the elastic sheet. The flexible battery also can include a borophene cap. The borophene cap can be located at a second end of the pyroelectric peptide microtubule. The borophene cap can collect a charge created by the pyroelectric peptide microtubule. The flexible battery also can include an insulating ring. The insulating ring can be located at the second end of the pyroelectric peptide microtubule. The flexible battery also can include a collection wire. The collection wire can be located at the second end of the pyroelectric peptide microtubule. The collection wire can direct the charge to a borophene capacitor charge system.

In some embodiments, movement of the elastic sheet can provide mechanical energy that can be converted to a current by the pyroelectric peptide microtubule. In some embodiments, heat energy at the borophene sheet can be converted to a current by the pyroelectric peptide microtubule. In some embodiments, the borophene capacitor charge system can include a borophene capacitor. The borophene capacitor can include a first borophene plate, a second borophene plate, and a layer of insulating material that can be located between the first borophene plate and the second borophene plate. In some embodiments, the borophene capacitor further can include an output.

In some embodiments, the flexible battery also can include another pyroelectric peptide microtubule. A first end of the other pyroelectric peptide microtubule can be located adjacent to the borophene sheet. The flexible battery also can include another borophene cap. The other borophene cap can be located at a second end of the other pyroelectric peptide microtubule. The other borophene cap can collect another charge created by the other pyroelectric peptide microtubule. The flexible battery also can include another collection wire. The other collection wire can be located at the second end of the other pyroelectric peptide microtubule. The other collection wire can direct the other charge to the borophene capacitor charge system. In some embodiments, the flexible battery also can include a flexible structural housing. The flexible structural housing can have two or more borophene patches, a negative terminal, and a positive terminal.

According to yet another aspect, a method is disclosed. The method can include connecting, by a flexible battery manufacturing device, a first side of a borophene sheet to an elastic sheet. The borophene sheet can have a thickness of at least one atom. The method further can include connecting, by the flexible battery manufacturing device, a first end of a pyroelectric peptide microtubule to a second side of the borophene sheet; and connecting, by the flexible battery manufacturing device, a borophene cap to a second end of the pyroelectric peptide microtubule. The borophene cap can collect a charge generated by the pyroelectric peptide microtubule. The method also can include connecting, by the flexible battery manufacturing device, a collection wire to the second end of the pyroelectric peptide microtubule; and connecting, by the flexible battery manufacturing device, the collection wire to a borophene capacitor charge system. The borophene capacitor charge system can store a charge.

Other systems, devices, methods, and/or computer program products according to embodiments will be or become apparent to one with skill in the art upon review of the following drawings and detailed description. It is intended that all such additional systems, devices, methods, and/or computer program products be included within this description and within the scope of this disclosure.

DETAILED DESCRIPTION

The following detailed description is directed to a flexible battery and methods for making a flexible battery. Embodiments of the flexible battery illustrated and described herein include flexible batteries that are flexible and dry. Furthermore, some embodiments of the flexible battery illustrated and described herein can be self-charging and therefore do not require input of electrical current and/or charging. A flexible battery can be formed from a borophene sheet, a pyroelectric peptide microtubule attached to the borophene sheet, a borophene cap, a collection wire, and a borophene capacitor charge system. An insulating ring can be included to prevent leakage of charge at or near a top of the pyroelectric peptide microtubule.

Heat and/or movement at or near the borophene sheet can be converted by the pyroelectric peptide microtubule into a current. The current can be collected by the borophene cap at or near the top of the pyroelectric peptide microtubule. The current can be channeled or directed by the collection wire to a borophene capacitor charge system. The borophene capacitor charge system can include one or more borophene capacitors, each of which can include two borophene plates separated by a layer of insulating material. Charge from the borophene capacitor charge system can be output to a switch or device. The flexible batteries can include one or more cells, and the flexible batteries can be located within a housing, in some embodiments. Additional aspects of the concepts and technologies disclosed herein will be illustrated and described in more detail below.

While the subject matter described herein is presented in the general context of program modules that execute in conjunction with the execution of an operating system and application programs on a computer system, those skilled in the art will recognize that other implementations may be performed in combination with other types of program modules. Generally, program modules include routines, programs, components, data structures, and other types of structures that perform particular tasks or implement particular abstract data types. Moreover, those skilled in the art will appreciate that the subject matter described herein may be practiced with other computer system configurations, including hand-held devices, multiprocessor systems, microprocessor-based or programmable consumer electronics, minicomputers, mainframe computers, and the like.

Figure 1:
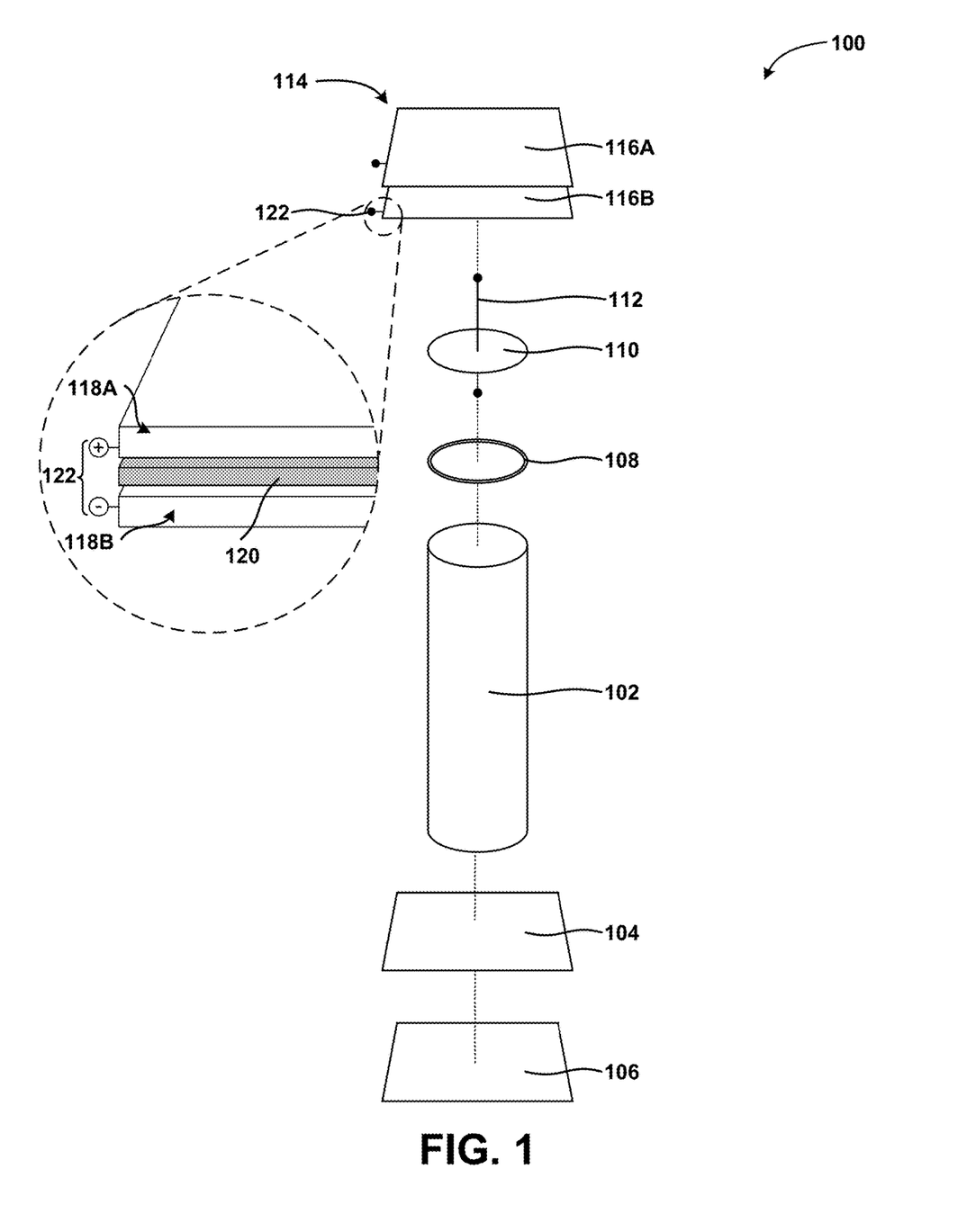
FIG. 1 is an assembly diagram illustrating components of a flexible battery, according to various embodiments of the concepts and technologies described herein.

Referring now to FIG. 1, aspects of a flexible battery 100 will be described, according to an illustrative embodiment of the concepts and technologies disclosed herein. In particular, FIG. 1 is an assembly drawing showing some example components of the flexible battery 100, according to some example embodiments of the concepts and technologies disclosed herein. As will be explained in more detail herein, the flexible battery 100 shown in FIG. 1 is one example embodiment of the concepts and technologies described herein and therefore should not be construed as being limiting in any way.

In the illustrated embodiment, the flexible battery 100 includes one or more pyroelectric peptide microtubules 102.

According to various embodiments, the flexible battery 100 can have any number of pyroelectric peptide microtubules 102. According to various embodiments of the concepts and technologies disclosed herein, the pyroelectric peptide microtubule 102 can be formed or obtained in various lengths and/or radii. The lengths can be determined to accommodate a power requirement or goal, a size requirement or goal, an aesthetic requirement or goal, and/or other considerations. According to various embodiments of the concepts and technologies disclosed herein, the pyroelectric peptide microtubules 102 can be formed with a length of one millimeter and a width of one to three microns, though the pyroelectric peptide microtubules 102 can be scaled as needed or desired for various reasons.

According to various embodiments of the concepts and technologies disclosed herein, the pyroelectric peptide microtubules 102 can include organic nano-structures that function as flexile power cell base units for the flexible battery 100. The pyroelectric peptide microtubules 102 can convert heat and/or motion into an electric current. Thus, as the pyroelectric peptide microtubules 102 move, a current can be generated within the moving pyroelectric peptide microtubules 102. Similarly, if the pyroelectric peptide microtubules 102 are placed at or near a heat source, the pyroelectric peptide microtubules 102 can generate a current. In particular, in response to movement and/or heat, the pyroelectric peptide microtubules 102 can generate a current. The current generated by the pyroelectric peptide microtubules 102 can be harnessed by, channeled by, and/or stored by other structures, as will be explained in more detail below. Thus, according to various embodiments of the concepts and technologies disclosed herein, the pyroelectric peptide microtubules 102 can function as the basic power cell units of the flexible battery 100. It should be understood that this example is illustrative, and therefore should not be construed as being limiting in any way.

In some embodiments, the one or more pyroelectric peptide microtubules 102 can be attached to, connected to, or otherwise disposed at or near an elastic sheet 104 shown in FIG. 1. It should be noted that some embodiments of the flexible battery 100 can omit the elastic sheet 104 (e.g., some implantable versions of the flexible battery 100 or other versions of the flexible battery 100 may not include an elastic sheet 104 for various reasons). The elastic sheet 104 can be provided to act as a substrate, "backbone," platform, or other support structure of and/or for the pyroelectric peptide microtubules 102. According to various embodiments, the elastic sheet 104 can be flexible and/or stretchable. Thus, while in some embodiments the elastic sheet 104 can function as a support structure for the pyroelectric peptide microtubules 102, the elastic sheet 104 nonetheless can be flexible (bendable, twistable, and stretchable) so that the flexible battery 100 can be bent, twisted, stretched, and/or otherwise flexed to accommodate movement in and/or along various axes. According to some embodiments of the concepts and technologies disclosed herein, the elastic sheet 104 can be formed from a material that is thermally conductive. According to some other embodiments of the concepts and technologies disclosed herein, the elastic sheet 104 can be formed from a material that is electrically conductive. It should be understood that these examples are illustrative, and therefore should not be construed as being limiting in any way.

According to various embodiments, the elastic sheet 104 can be joined, attached, connected, and/or otherwise disposed at or adjacent to a borophene sheet 106. The borophene sheet 106 can be formed in any desired size, based on size requirements and/or size preferences. Borophene can have a thickness of one atom and can be flexible. Also, borophene can be thermally conductive and/or electrically conductive. In fact, in some embodiments, borophene may be highly conductive and potentially superconductive. Thus, the borophene sheet 106 can be provided to collect thermal and/or electrical energy and to collect the thermal and/or electric energy. The thermal and/or electric energy can pass through the elastic sheet 104 and into the pyroelectric peptide microtubules 102. In some embodiments, wherein the borophene sheet 106 is attached to the elastic sheet 104, the borophene sheet 106 can retain its ability to flex, bend, and/or stretch, as well as its electronic properties. It should be understood that these examples are illustrative, and therefore should not be construed as being limiting in any way.

Although FIG. 1 illustrates a borophene sheet 106, it should be understood that other two dimensional materials may be substituted for the borophene included in the borophene sheet 106. For example, some contemplated embodiments of the concepts and technologies disclosed herein may use graphene or other structures instead of borophene. In the claims, however, the word "borophene" is used to refer exclusively to "borophene" and excludes graphene and other existing two-dimensional materials. The phrase "two-dimensional sheet" as used in the claims refers to any two-dimensional sheet including the borophene sheet 106 illustrated and described herein, as well as equivalent structures formed from other two-dimensional materials.

According to various embodiments of the concepts and technologies disclosed herein, the borophene sheet 106 and the elastic sheet 104 can be used to produce mechanical movement that will be used by the pyroelectric peptide microtubules 102 for conversion into electrical current. In particular, external twisting and/or other movements of the elastic sheet 104 (and/or the borophene sheet 106 attached thereto) can transmit motion into the pyroelectric peptide microtubules 102. This motion can be converted by the pyroelectric peptide microtubules 102 into energy as illustrated and described herein. It should be understood that this example is illustrative, and therefore should not be construed as being limiting in any way.

To ease further description of the flexible battery 100, the following conventions are used herein. A first end of the pyroelectric peptide microtubule 102 and/or flexible battery 100 that is located near or at the elastic sheet 104 can be referred to herein as the "bottom" or "charging end" of the pyroelectric peptide microtubule 102 and/or as the bottom of the flexible battery 100. Similarly, a second end of the pyroelectric peptide microtubule 102 and/or the flexible battery 100 that is located at the opposite end (away from the elastic sheet 104) can be referred to herein as the "top" or "collection end" of the pyroelectric peptide microtubule 102 and/or as the top of the flexible battery 100. Again, such a use of these terms is adopted herein as a convention. It must be understood that the flexible battery 100 and/or components thereof (e.g., the pyroelectric peptide microtubules 102) can be oriented in any desired orientation (e.g., an orientation in which the top is located above the bottom or another orientation in which the bottom is located above the top). As such, the use of the terms "bottom" and "top" with respect to the pyroelectric peptide microtubules 102, the flexible battery 100, and/or other structures illustrated and described herein is only for purposes of illustration and should not be construed as being limiting in any way.

According to some embodiments, the flexible battery 100 can include an insulating ring 108. The insulating ring 108 can be located at a top of the pyroelectric peptide microtubule 102. The insulating ring 108 can be provided to prevent loss of current and/or thermal energy at the top end of the pyroelectric peptide microtubule 102. According to various embodiments, the insulating ring 108 can be formed from any desired materials, coatings, or the like, that can block an electric current and/or charge. It should be understood that this example is illustrative, and therefore should not be construed as being limiting in any way.

Each of the one or more pyroelectric peptide microtubules 102 can be capped by a sheet or cap of borophene (hereinafter referred to as a "borophene cap") 110. The borophene cap 110 can be provided to collect the charge generated by the pyroelectric peptide microtubule 102 to which the borophene cap 110 is attached. Thus, a heat or motion can be input to a charging end of a pyroelectric peptide microtubule 102, and a charge generated by the pyroelectric peptide microtubule 102 can be collected by the borophene cap 110 located at the collection end of that pyroelectric peptide microtubule 102. It should be understood that this example is illustrative, and therefore should not be construed as being limiting in any way.

According to various embodiments, a collection wire 112 can be disposed at the collection end of the pyroelectric peptide microtubules 102. The collection wire 112 can be located in, at, or adjacent to the borophene cap 110. In some embodiments, including the embodiment shown in FIG. 1, the collection wire 112 can pass through the borophene cap 110 and into the pyroelectric peptide microtubule 102. It should be understood that this example is illustrative, and therefore should not be construed as being limiting in any way.

The collection wire 112 can draw current off of the borophene cap 110. Thus, the collection wire 112 can lead current away from the pyroelectric peptide microtubule 102 and/or other structures as illustrated and described herein. According to various embodiments of the concepts and technologies disclosed herein, the collection wire 112 can draw current from the borophene cap 110 and/or from the pyroelectric peptide microtubule 102 via the borophene cap 110 and lead that current to a storage device. It should be understood that this example is illustrative, and therefore should not be construed as being limiting in any way.

According to various embodiments of the concepts and technologies disclosed herein, the storage device can include a capacitor or a bank of capacitors that can function as a borophene capacitor charge system 114. According to various embodiments, the borophene capacitor charge system 114 can include two or more borophene capacitors 116A-116B (hereinafter collectively and/or generically referred to as "borophene capacitors 116").

In various embodiments, one or more of the borophene capacitors 116 of the borophene capacitor charge system 114 can be formed by two or more layered borophene plates 118A-118B (hereinafter collectively and/or generically referred to as "borophene plates 118") and an insulating elastic material layer 120 that can be disposed between the borophene plates 118. A detail of an example structure for the borophene capacitors 116 is shown in FIG. 1. It can be appreciated that the borophene plates 118 and the elastic material layer 120 can provide a flexible capacitor. It should be understood that this example is illustrative, and therefore should not be construed as being limiting in any way.

In some embodiments, because each of the borophene capacitors 116 can be flexible, the borophene capacitor charge system 114 also can be flexible. It should be understood that this example is illustrative, and therefore should not be construed as being limiting in any way.

The borophene capacitor charge system 114 can include one or more outputs 122. The output 122 can provide power from the borophene capacitor charge system 114 (or from one or more of the borophene capacitors 116). As shown in the inset shown in FIG. 1, the output 122 can include a positive output or terminal that can be located at a first of the borophene plates 118 of a borophene capacitor 116 and a negative output or terminal that can be located at a second of the borophene plates 118 of the borophene capacitor 116. Thus, by activation of a switch or connection of the output 122 to other circuits, a charge stored across the borophene capacitor 116 can be discharged through the output 122 and to a circuit or device.

In some other embodiments, the output 122 can be configured to output a charge from the entire borophene capacitor charge system 114 and/or multiple borophene capacitors 116. Thus, multiple borophene plates 118 that are configured to be charged positively can be connected to a positive output or terminal of the borophene capacitor charge system (e.g., a positive terminal of the output 122) and multiple borophene plates 118 that are configured to be charged negatively can be connected to a negative output or terminal of the borophene capacitor charge system (e.g., a negative terminal of the output 122). It should be understood that this example is illustrative, and therefore should not be construed as being limiting in any way.

FIG. 1 illustrates one pyroelectric peptide microtubule 102, one elastic sheet 104, one borophene sheet 106, one insulating ring 108, one borophene cap 110, one collection wire 112; and one borophene capacitor charge system 114. It should be understood, however, that various implementations of the flexible battery 100 can include one or more than one pyroelectric peptide microtubule 102; one or more than one elastic sheet 104; one or more than one borophene sheet 106; one or more than one insulating ring 108; one or more than one borophene cap 110; one or more than one collection wire 112; and/or one or more than one borophene capacitor charge system 114. As such, the illustrated embodiment should be understood as being illustrative, and should not be construed as being limiting in any way.

Figure 2:
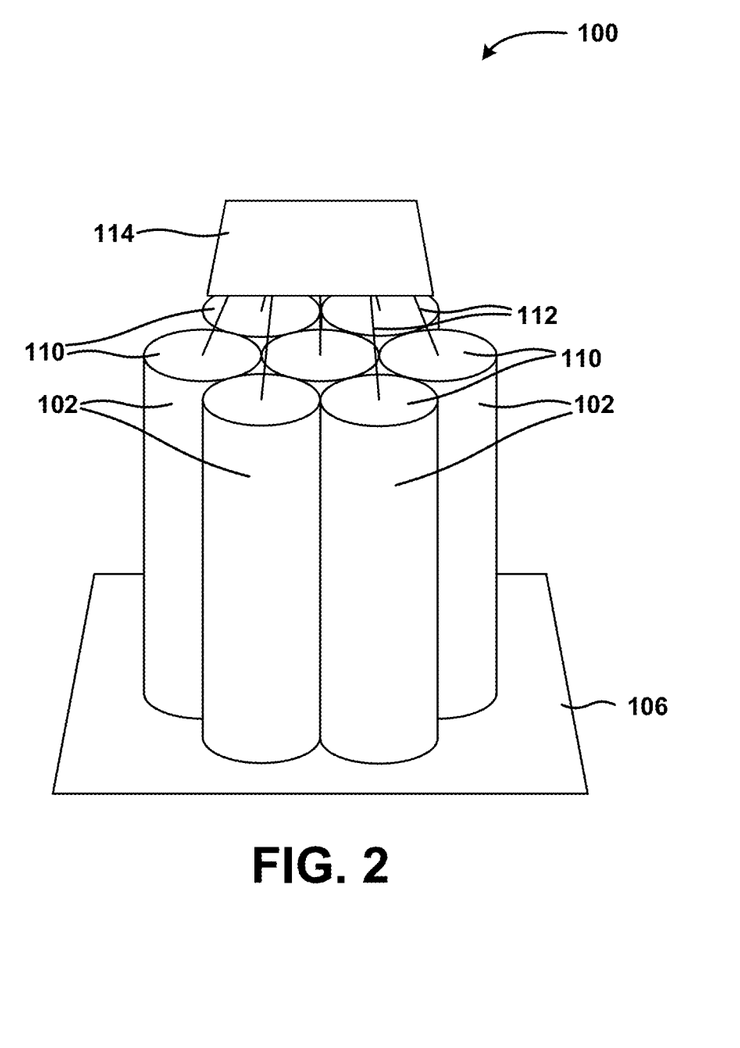
FIG. 2 is a line drawing that schematically illustrates an operating environment for a flexible battery, according to an example embodiment of the concepts and technologies disclosed herein.

FIG. 2 is a line drawing that schematically illustrates a multiple-cell ("multi-cell") version of the flexible battery 100, according to an example embodiment of the concepts and technologies disclosed herein. As shown in FIG. 2, a multi-cell version of the flexible battery 100 can include a borophene sheet 106 and, if included, an elastic sheet 104. The multi-cell version of the flexible battery 100 also can include two or more pyroelectric peptide microtubules 102. Although the illustrated embodiment of the multi-cell version of the flexible battery 100 is shown as including seven pyroelectric peptide microtubules 102, it should be understood that the number of pyroelectric peptide microtubules 102 can be varied as desired to satisfy various constraints including, but not limited to, power requirements, power preferences, aesthetic preferences, aesthetic requirements, size requirements, size preferences, combinations thereof, or the like. Various embodiments of the concepts and technologies disclosed herein include a multi-cell version of the flexible battery 100 having two pyroelectric peptide microtubules 102 and multi-cell versions of the flexible battery 100 having almost any number of pyroelectric peptide microtubules 102 including tens, hundreds, thousands, and even more pyroelectric peptide microtubules 102. As such, the illustrated embodiment must be understood as being illustrative and should not be construed as being limiting in any way.

As shown in FIG. 2, each pyroelectric peptide microtubule 102 of the multi-cell version of the flexible battery 100 can have a respective borophene cap 110 and collection wire 112, whereby current generated by each of the pyroelectric peptide microtubules 102 can be collected and routed from the pyroelectric peptide microtubules 102 to a borophene capacitor charge system 114. As shown in FIG. 2, the collection wires 112 can be connected to the same borophene capacitor charge system 114, whereby the borophene capacitor charge system 114 can be charged by multiple pyroelectric peptide microtubules 102 of the multi-cell version of the flexible battery 100. In some other embodiments, each of the pyroelectric peptide microtubules 102 can have a dedicated borophene capacitor charge system 114, if desired (e.g., to provide redundancy, etc.). In some embodiments, however, the single borophene capacitor charge system 114 can be used. In some embodiments, the single borophene capacitor charge system 114 may be used to reduce the time to obtain a charge of a desired level, though this is not necessarily the case. At any rate, it should be understood that the illustrated embodiment is illustrative, and therefore should not be construed as being limiting in any way.

Figure 3:
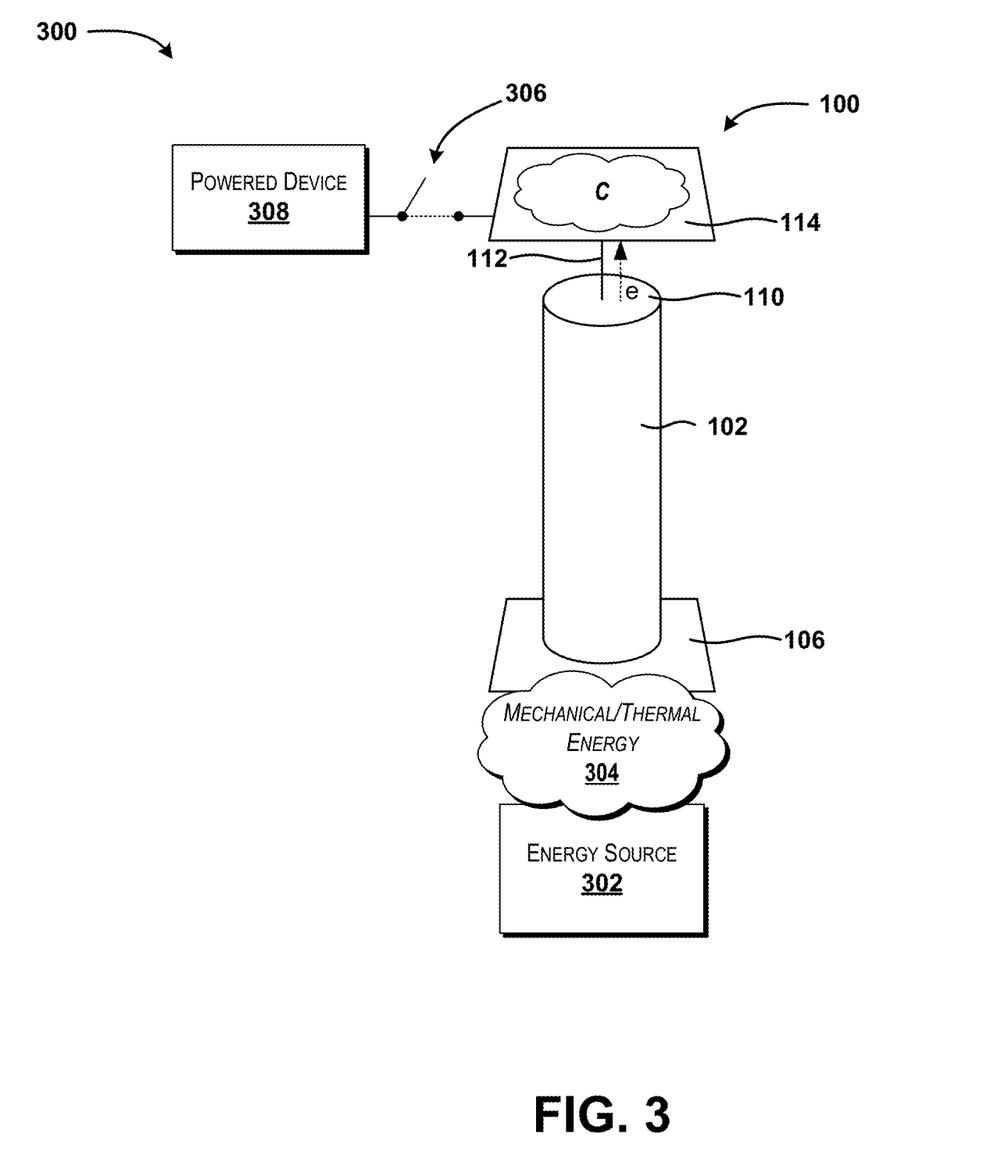
FIG. 3 is a line drawing showing a multiple-cell version of a flexible battery, according to an example embodiment of the concepts and technologies disclosed herein.

FIG. 3 is a line drawing that schematically illustrates an operating environment 300 for a flexible battery 100, according to some embodiments of the concepts and technologies disclosed herein. As shown in FIG. 3, the operating environment 300 can include a flexible battery 100. It can be appreciated with collective reference to FIGS. 1-2 that the flexible battery 100 shown in FIG. 3 can correspond to a single cell version of the flexible battery 100 (e.g., an assembled version of the components illustrated in FIG. 1) and/or a multiple cell version of the flexible battery 100 as shown in FIG. 2. It should be understood that the illustrated embodiment is illustrative and that other embodiments of the flexible battery 100 as illustrated and described herein can be used in the operating environment 300 illustrated and described in FIG. 3. As such, this embodiment should not be construed as being limiting in any way.

As shown in FIG. 3, the flexible battery 100 can be located in, at, or near an energy source 302. According to various embodiments of the concepts and technologies disclosed herein, the energy source 302 can be a source of mechanical and/or thermal ("mechanical/thermal") energy 304. Thus, the energy source 302 can generate heat or movement of almost any nature. In some embodiments, the energy source 302 can correspond to a human body, and the mechanical/thermal energy 304 can correspond to body heat, motion of the body, or a combination of body heat and motion of the body.

In some other embodiments, the energy source 302 can correspond to an exhaust system for an electronic device (e.g., a heat exhaust of a computer device, a heat exhaust of a television or display, or other electronics); a heat exhaust for a mechanical device (e.g., a heat exhaust for a refrigerator, an exhaust for an automobile or component thereof, a heat exhaust for a lighting device, or other mechanical device); a moving part of any device; a thermal sink or other thermal output for any device; combinations thereof; or the like. In light of the various examples set forth above, it should be understood that according to various embodiments, the mechanical/thermal energy 304 can include only mechanical energy, only thermal energy, or a combination of mechanical and thermal energy.

As explained above, the mechanical/thermal energy 304 can pass into the flexible battery 100 through the borophene sheet 106 and, if included, the elastic sheet 104. The mechanical/thermal energy 304 can be converted by the pyroelectric peptide microtubule 102 into a current, illustrated in FIG. 3 as electrical energy e. The electrical energy e can be captured by the borophene cap 110 of the flexible battery 100 and channeled (or directed) by the collection wire 112 to a borophene capacitor charge system 114. As is generally understood, a charge C can build on, across, and/or within the borophene capacitor charge system 114, and the charge C can be used when desired.

In some embodiments, the output 122 can be controlled by a switch 306. When the switch 306 is closed, the charge C can be used to power a powered device 308. It should be understood that the switch 306 can be formed as a component of the powered device 308, and that as such, the powered device 308 can be configured to access the charge C without external control/interference. Thus, the flexible battery 100 can be connected to the powered device 308 and the powered device 308 can be powered by the charge C that can be stored in the borophene capacitor charge system 114. It should be understood that this example is illustrative, and therefore should not be construed as being limiting in any way.

According to various embodiments, the flexible battery 100 can be implanted in a body (human or animal), placed on a body (human or animal), put onto or into devices (e.g., Internet of Things devices, other devices, or the like), embedded in various structures, and/or otherwise located in any number of beings, structures, devices, or the like. As such, it should be understood that the operating environment 300 shown in FIG. 3 can correspond, in various embodiments, to a body, structure, device, or other entity. As such, the above examples are illustrative and should not be construed as being limiting in any way.

Figure 4:
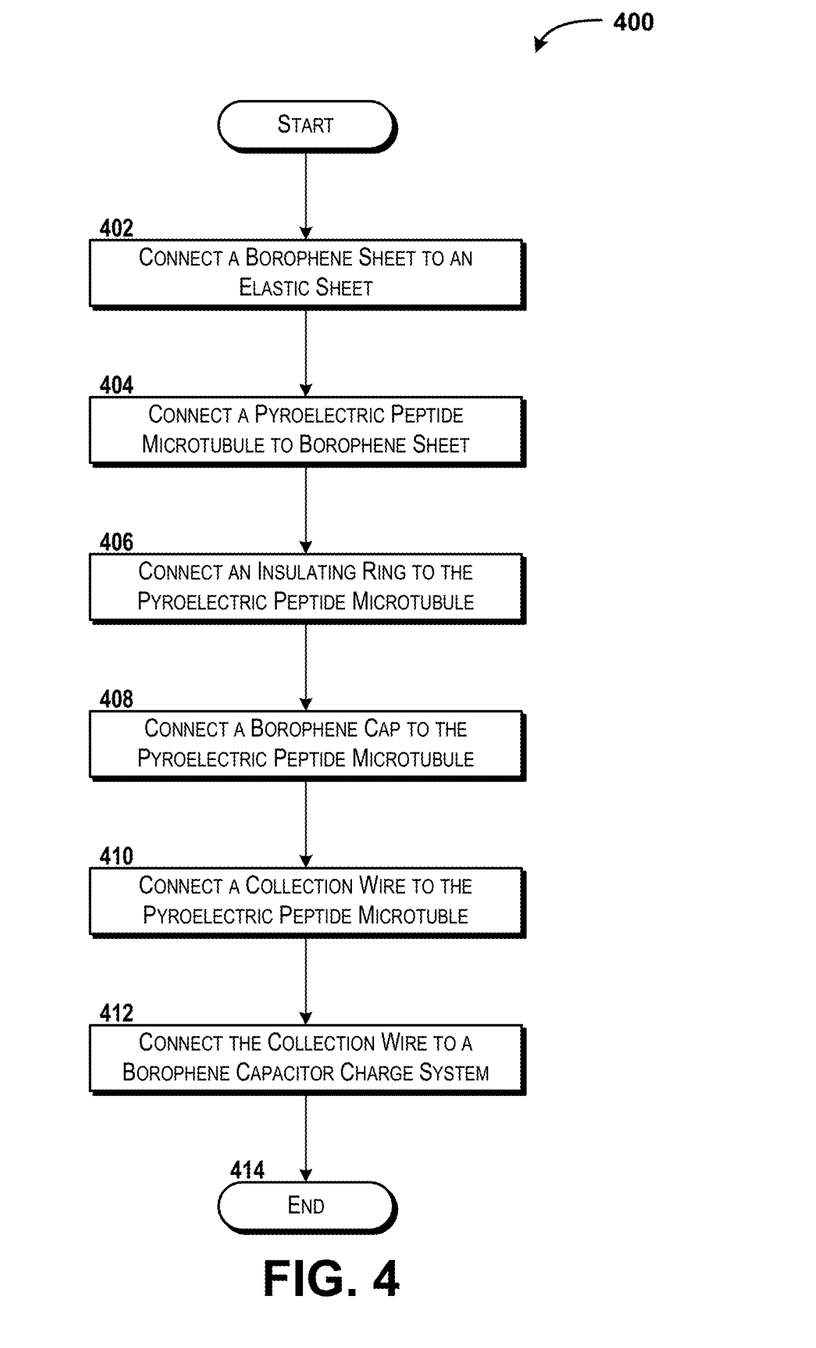
FIG. 4 is a flow diagram showing aspects of a method for forming a flexible battery, according to an illustrative embodiment of the concepts and technologies described herein.

Turning now to FIG. 4, aspects of a method 400 for forming a flexible battery 100 will be described in detail, according to an illustrative embodiment. It should be understood that the operations of the methods disclosed herein are not necessarily presented in any particular order and that performance of some or all of the operations in an alternative order(s) is possible and is contemplated. The operations have been presented in the demonstrated order for ease of description and illustration. Operations may be added, omitted, and/or performed simultaneously, without departing from the scope of the concepts and technologies disclosed herein.

It also should be understood that the methods disclosed herein can be ended at any time and need not be performed in its entirety. Some or all operations of the methods, and/or substantially equivalent operations, can be performed by execution of computer-readable instructions included on a computer storage media, as defined herein. The term "computer-readable instructions," and variants thereof, as used herein, is used expansively to include routines, applications, application modules, program modules, programs, components, data structures, algorithms, and the like. Computer-readable instructions can be implemented on various system configurations including single-processor or multiprocessor systems, minicomputers, mainframe computers, personal computers, hand-held computing devices, microprocessor-based, programmable consumer electronics, combinations thereof, and the like.

Thus, it should be appreciated that the logical operations described herein are implemented (1) as a sequence of computer implemented acts or program modules running on a computing system and/or (2) as interconnected machine logic circuits or circuit modules within the computing system. The implementation is a matter of choice dependent on the performance and other requirements of the computing system. Accordingly, the logical operations described herein are referred to variously as states, operations, structural devices, acts, or modules. These states, operations, structural devices, acts, and modules may be implemented in software, in firmware, in special purpose digital logic, and any combination thereof. As used herein, the phrase "cause a processor to perform operations" and variants thereof is used to refer to causing a processor of a computing system or device, such as a flexible battery manufacturing device, to perform one or more operations and/or causing the processor to direct other components of the computing system or device to perform one or more of the operations.

For purposes of illustrating and describing the concepts of the present disclosure, the method 400 is described herein as being performed by a flexible battery manufacturing device via execution of one or more software modules such as, for example, a flexible battery manufacturing routine or flexible battery manufacturing application. It should be understood that additional and/or alternative devices and/or network nodes can provide the functionality described herein via execution of one or more modules, applications, and/or other software including, but not limited to, the flexible battery manufacturing routine or flexible battery manufacturing application. Thus, the illustrated embodiments are illustrative, and should not be viewed as being limiting in any way.

The method 400 begins at operation 402. At operation 402, the flexible battery manufacturing device can connect a borophene sheet 106 to an elastic sheet 104. As explained above, the elastic sheet 104 can be provided as a substrate, platform, backbone, or the like, for the flexible battery 100. In some embodiments, as noted above, the elastic sheet 104 can be omitted, and as such, the functionality illustrated and described herein with reference to operation 402 can be omitted, in some embodiments. In embodiments in which the elastic sheet 104 is included, operation 402 can include depositing, attaching, connecting, or otherwise locating the borophene sheet 106 at or adjacent to the elastic sheet 104 using any desired process. The borophene sheet 106 can be connected to or attached to the elastic sheet 104, if desired, using any desired process and/or materials.

As explained above, the borophene sheet 106 can be one atom thick or thicker. The borophene sheet 106 can be formed using various processes and/or operations. In one contemplated embodiment, the borophene sheet 106 can be formed by depositing boron onto a silver substrate. The boron can be deposited to the silver using molecular beam epitaxy, in some embodiments. In some embodiments, the ambient temperature during borophene formation can be varied to change the properties of the resulting borophene. Because the properties of the borophene may be determined based on preferences and/or requirements, the temperature used during formation and/or other aspects of the borophene formation process may be varied. Therefore the above examples are illustrative and should not be construed as being limiting in any way.

From operation 402, the method 400 can proceed to operation 404. At operation 404, the flexible battery manufacturing device can connect a pyroelectric peptide microtubule 102 to the borophene sheet 106. Of course, it should be understood that if the flexible battery 100 being formed or manufactured by way of the method 400 corresponds to a multi-cell version of the flexible battery 100, that operation 404 can include connecting multiple pyroelectric peptide microtubules 102 to the borophene sheet 106. The pyroelectric peptide microtubules 102 can be connected to the borophene sheet 106 using any desired processes and/or materials.

From operation 404, the method 400 can proceed to operation 406. At operation 406, the flexible battery manufacturing device can connect an insulating ring 108 to the pyroelectric peptide microtubule 102. For multi-cell versions of the flexible battery 100, operation 406 can include connecting multiple insulating rings 108, where one insulating ring 108 can be connected to each of the pyroelectric peptide microtubules 102, in various embodiments. As explained above, the insulating rings 108 can prevent energy leakage or dissipation around the pyroelectric peptide microtubules 102, in various embodiments.

From operation 406, the method 400 can proceed to operation 408. At operation 408, the flexible battery manufacturing device can connect a borophene cap 110 to the pyroelectric peptide microtubule 102. For multi-cell versions of the flexible battery 100, operation 408 can include connecting multiple borophene caps 110. In particular, operation 408 can correspond to connecting a borophene cap 110 to each of the pyroelectric peptide microtubules 102 of the flexible battery 100. As explained above, the borophene caps 110 can be included to collect the charge created by the respective pyroelectric peptide microtubules 102, in various embodiments.

From operation 408, the method 400 can proceed to operation 410. At operation 410, the flexible battery manufacturing device can connect a collection wire 112 to the pyroelectric peptide microtubules 102. For multi-cell versions of the flexible battery 100, operation 410 can include connecting multiple collection wires 112. In particular, operation 410 can correspond to connecting a collection wire 112 to each of the pyroelectric peptide microtubules 102 of the flexible battery 100. As explained above, the collection wires 112 can be included to drain or direct the charge created by the respective pyroelectric peptide microtubules 102 and/or collected by the borophene caps 110 to a desired location or component, in various embodiments.

From operation 410, the method 400 can proceed to operation 412. At operation 412, the flexible battery manufacturing device can connect the collection wire 112 to a borophene capacitor charge system 114. For multi-cell versions of the flexible battery 100, operation 412 can include connecting multiple collection wires 112 to a single borophene capacitor charge system 114 and/or connecting multiple collection wires 112 to a two or more borophene capacitor charge system 114. It should be noted that according to various embodiments of the concepts and technologies disclosed herein, a borophene capacitor charge system 114 can be fed by one or more collection wires 112. Also, some flexible batteries 100 may have multiple borophene capacitor charge systems 114 having different charges (e.g., fed by different numbers of collection wires 112) to enable, if desired, multiple voltages or charges. Thus, some embodiments of the flexible battery 100 can have different voltages and/or currents.

From operation 412, the method 400 can proceed to operation 414. The method 400 can end at operation 414.

Figure 5:
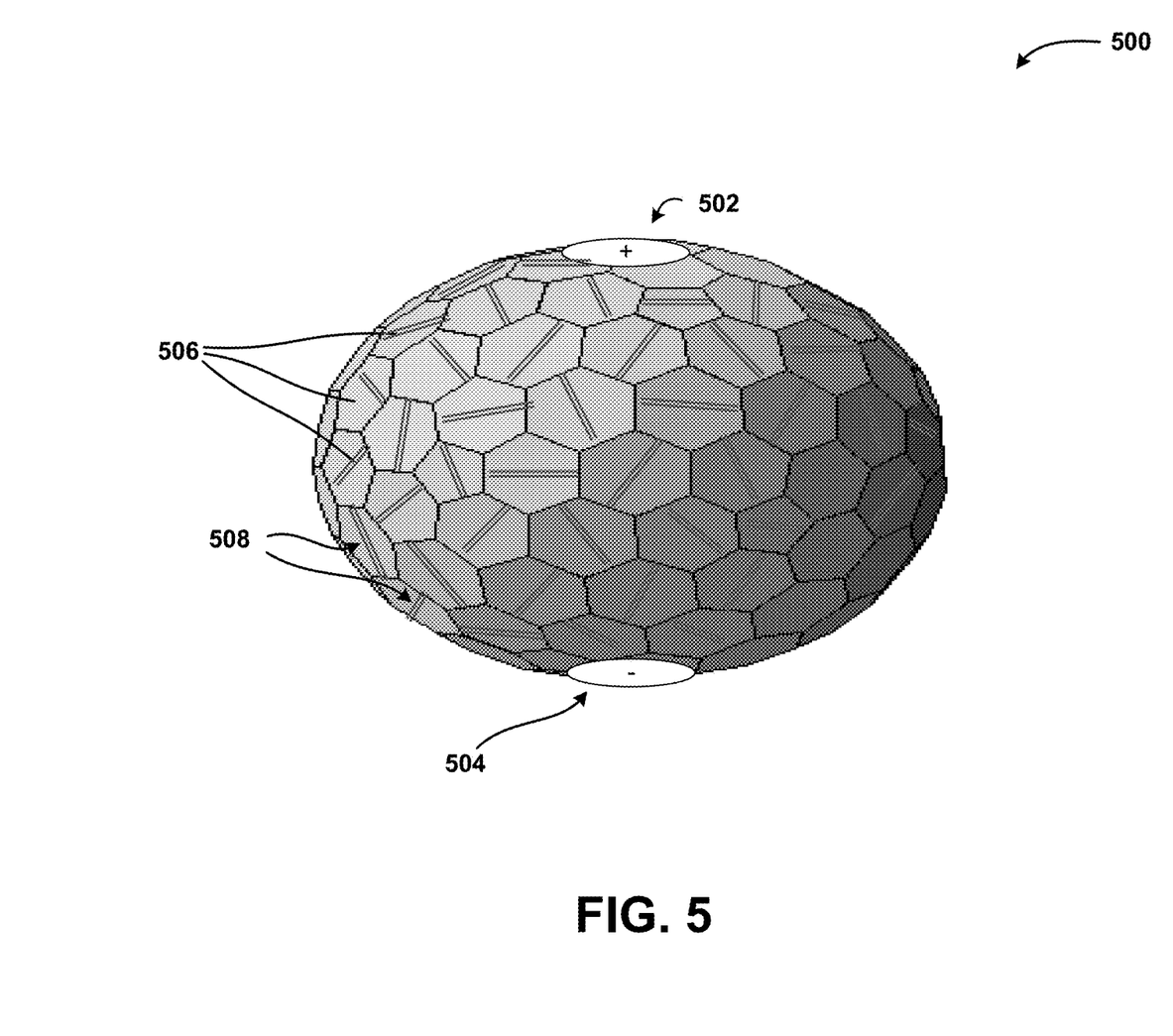
FIG. 5 is a line drawing showing a flexible structural housing for a flexible battery, according to an example embodiment of the concepts and technologies disclosed herein.

FIG. 5 illustrates a flexible structural housing 500 for a flexible battery 100, according to an example embodiment of the concepts and technologies disclosed herein. According to various embodiments of the concepts and technologies disclosed herein, a flexible battery 100 (single cell and/or multiple cell versions) can be located within the flexible structural housing 500. The flexible structural housing 500 (and the flexible battery 100 located within) can be implanted into a body (human or animal), located within other structures, located in fluids (e.g., flowing or stationary liquids or gases), or located in other media. The output 122 of the flexible battery 100 can be connected to a positive terminal 502 and negative terminal 504. Thus, the flexible structural housing 500 can provide connection points and therefore may be similar to a battery housing as generally is known.

The flexible structural housing 500 can be formed from one or more pieces of stretchable borophene ("borophene patches") 506. In the illustrated embodiment, multiple octagonal sheets of borophene are used to provide the borophene patches 506, and the borophene patches 506 can be joined together to form the outer surface of the flexible structural housing 500. One or more of the borophene patches 506 can be joined to or connected to a compression resistant support 508. In some embodiments, the functionality of the borophene patches 506 can be provided by the borophene sheets 106 of multiple flexible batteries 100 that, when joined together, form the flexible structural housing 500. It should be understood that this example is illustrative, and therefore should not be construed as being limiting in any way.

Figure 6:
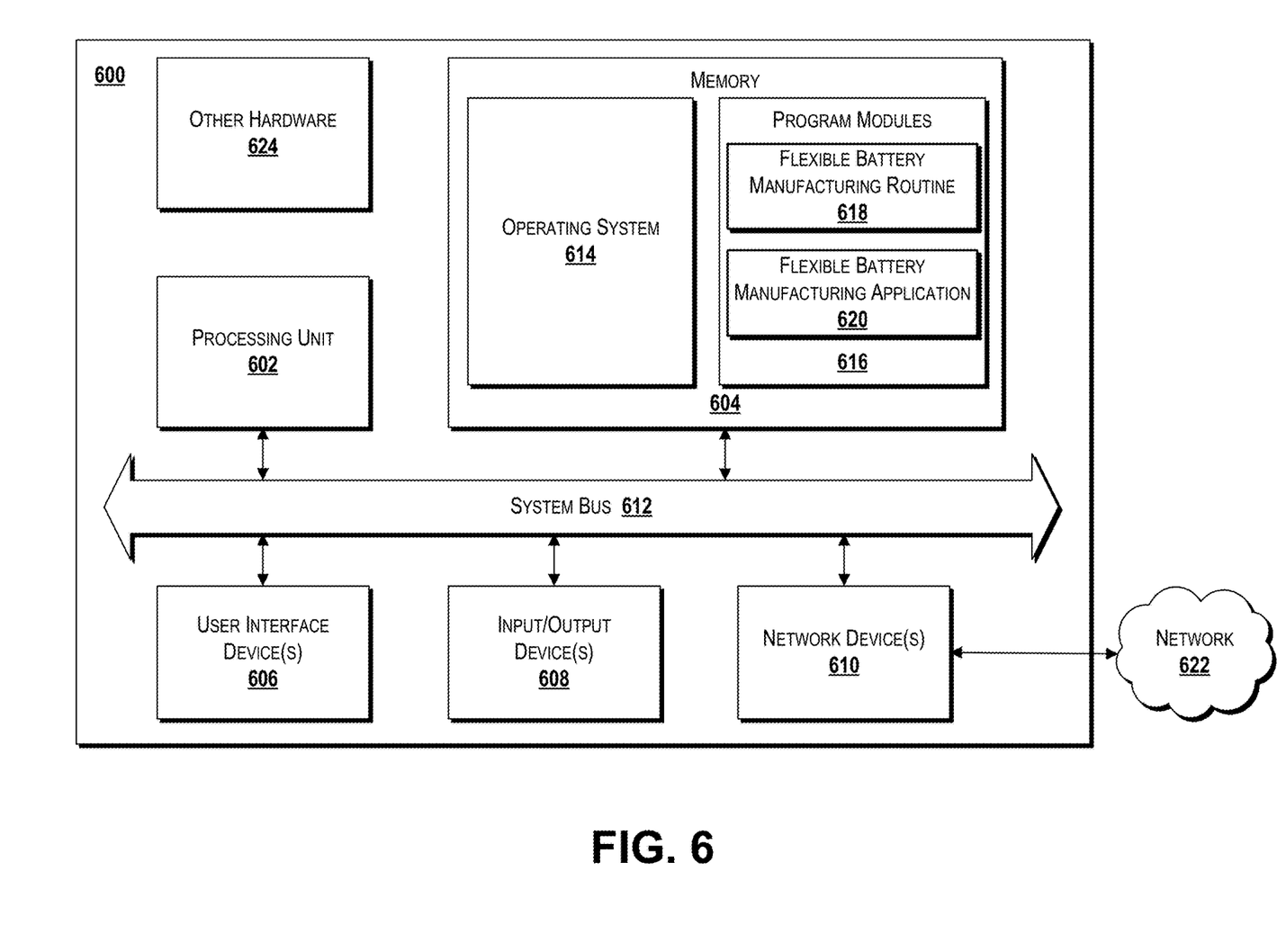
FIG. 6 is a block diagram illustrating an example computer system configured to manufacture flexible batteries, according to some illustrative embodiments of the concepts and technologies described herein.

FIG. 6 is a block diagram illustrating a flexible battery manufacturing device 600 configured to provide the functionality described herein for manufacturing flexible batteries 100 in accordance with various embodiments of the concepts and technologies disclosed herein. The flexible battery manufacturing device 600 includes a processing unit 602, a memory 604, one or more user interface devices 606, one or more input/output ("I/O") devices 608, and one or more network devices 610, each of which is operatively connected to a system bus 612. The bus 612 enables bi-directional communication between the processing unit 602, the memory 604, the user interface devices 606, the I/O devices 608, and the network devices 610.

The processing unit 602 can include a standard central processor that performs arithmetic and logical operations, a more specific purpose programmable logic controller ("PLC"), a programmable gate array, or other type of processor known to those skilled in the art and suitable for controlling the operation of the server computer. As used herein, the word "processor" and/or the phrase "processing unit" when used with regard to any architecture or system can include multiple processors or processing units distributed across and/or operating in parallel in a single machine or in multiple machines. Furthermore, processors and/or processing units can be used to support virtual processing environments. Processors and processing units also can include state machines, application-specific integrated circuits ("ASICs"), combinations thereof, or the like. Because processors and/or processing units are generally known, the processors and processing units disclosed herein will not be described in further detail herein.

The memory 604 can communicate with the processing unit 602 via the system bus 612. In some embodiments, the memory 604 can be operatively connected to a memory controller (not shown) that can enable communication with the processing unit 602 via the system bus 612. The memory 604 can include an operating system 614 and one or more program modules 616. The operating system 614 can include, but is not limited to, members of the WINDOWS families of operating systems from MICROSOFT CORPORATION, the LINUX family of operating systems, the SYMBIAN family of operating systems from SYMBIAN LIMITED, the BREW family of operating systems from QUALCOMM CORPORATION, the MAC OS, iOS, and/or LEOPARD families of operating systems from APPLE CORPORATION, the FREEBSD family of operating systems, the SOLARIS family of operating systems from ORACLE CORPORATION, other operating systems, and the like. The operating system 614 also can include custom operating systems.

The program modules 616 can include various software and/or program modules that can provide the functionality described herein. In some embodiments, for example, the program modules 616 can include a flexible battery manufacturing routine 618, a flexible battery manufacturing application 620, or other applications, routines, modules, or programs that can encompass functionality as illustrated and described herein. These and/or other routines, modules, applications, or programs can be embodied in computer-readable media containing instructions that, when executed by the processing unit 602, perform one or more operations of method 400 described in detail above with respect to FIG. 4 and/or other functionality as illustrated and described herein. It can be appreciated that, at least by virtue of the instructions embodying one or more operations of the method 400 and/or other functionality illustrated and described herein being stored in the memory 604 and/or accessed and/or executed by the processing unit 602, the processing unit 602 of the flexible battery manufacturing device 600 is a special-purpose processing unit that can facilitate providing the functionality illustrated and described herein. According to embodiments, the program modules 616 may be embodied in hardware, software, firmware, or any combination thereof. Although not shown in FIG. 6, it should be understood that the memory 604 also can be configured to store other data, if desired.

By way of example, and not limitation, computer-readable media may include any available computer storage media or communication media that can be accessed by the flexible battery manufacturing device 600. Communication media includes computer-readable instructions, data structures, program modules, or other data in a modulated data signal such as a carrier wave or other transport mechanism and includes any delivery media. The term "modulated data signal" means a signal that has one or more of its characteristics changed or set in a manner as to encode information in the signal. By way of example, and not limitation, communication media includes wired media such as a wired network or direct-wired connection, and wireless media such as acoustic, RF, infrared and other wireless media. Combinations of the any of the above should also be included within the scope of computer-readable media.

Computer storage media includes volatile and non-volatile, removable and non-removable media implemented in any method or technology for storage of information such as computer-readable instructions, data structures, program modules, or other data. Computer storage media includes, but is not limited to, RAM, ROM, Erasable Programmable ROM ("EPROM"), Electrically Erasable Programmable ROM ("EEPROM"), flash memory or other solid state memory technology, CD-ROM, digital versatile disks ("DVD"), or other optical storage, magnetic cassettes, magnetic tape, magnetic disk storage or other magnetic storage devices, or any other medium which can be used to store the desired information and which can be accessed by the flexible battery manufacturing device 600. In the claims, the phrase "computer storage medium" and variations thereof does not include waves or signals per se and/or communication media.

The user interface devices 606 may include one or more devices with which a user accesses the flexible battery manufacturing device 600. The user interface devices 606 may include, but are not limited to, computers, servers, personal digital assistants, cellular phones, or any suitable computing devices. The I/O devices 608 enable a user to interface with the program modules 616. In one embodiment, the I/O devices 608 are operatively connected to an I/O controller (not shown) that enables communication with the processing unit 602 via the system bus 612. The I/O devices 608 may include one or more input devices, such as, but not limited to, a keyboard, a mouse, or an electronic stylus. Further, the I/O devices 608 may include one or more output devices, such as, but not limited to, a display screen or a printer.

The network devices 610 enable the flexible battery manufacturing device 600 to communicate with other networks or remote systems via a network, such as the network 622. Examples of the network devices 610 include, but are not limited to, a modem, a radio frequency ("RF") or infrared ("IR") transceiver, a telephonic interface, a bridge, a router, or a network card. The network 622 may include a wireless network such as, but not limited to, a Wireless Local Area Network ("WLAN") such as a WI-FI network, a Wireless Wide Area Network ("WWAN"), a Wireless Personal Area Network ("WPAN") such as BLUETOOTH, a Wireless Metropolitan Area Network ("WMAN") such a WiMAX network, or a cellular network. Alternatively, the network 622 may be a wired network such as, but not limited to, a Wide Area Network ("WAN") such as the Internet, a Local Area Network ("LAN") such as the Ethernet, a wired Personal Area Network ("PAN"), or a wired Metropolitan Area Network ("MAN").

The flexible battery manufacturing device 600 also can include other hardware 624. The other hardware 624 can be controlled by the processing unit 602 and can be used to manufacture the flexible batteries 100 illustrated and described herein. Thus, for example, the other hardware 624 can include devices and/or structures for creating borophene, devices and/or structures for creating pyroelectric peptide microtubules 102, devices and/or structures for joining together various components of the flexible batteries 100 as illustrated and described herein, combinations thereof, or the like. As such, the other hardware 624 can include various raw material storage devices, manufacturing devices, and the like.

Based on the foregoing, it should be appreciated that flexible batteries and methods for forming flexible batteries have been disclosed herein. Although the subject matter presented herein has been described in language specific to computer structural features, methodological and transformative acts, specific computing machinery, and computer-readable media, it is to be understood that the concepts and technologies disclosed herein are not necessarily limited to the specific features, acts, or media described herein. Rather, the specific features, acts and mediums are disclosed as example forms of implementing the concepts and technologies disclosed herein.

The subject matter described above is provided by way of illustration only and should not be construed as limiting. Various modifications and changes may be made to the subject matter described herein without following the example embodiments and applications illustrated and described, and without departing from the true spirit and scope of the embodiments of the concepts and technologies disclosed herein.

The invention claimed is:

1. A flexible battery comprising:
   a borophene sheet;
   a pyroelectric peptide microtubule, wherein a first end of the pyroelectric peptide microtubule is located adjacent to the borophene sheet; and
   a borophene cap located at a second end of the pyroelectric peptide microtubule, wherein the borophene cap collects a charge created by the pyroelectric peptide microtubule, and wherein the charge is directed to a borophene capacitor.

2. The flexible battery of claim 1, wherein the pyroelectric peptide microtubule is attached to the borophene sheet.

3. The flexible battery of claim 1, further comprising an elastic sheet, wherein the borophene sheet is attached to the elastic sheet.

4. The flexible battery of claim 3, wherein movement of the elastic sheet provides mechanical energy that is converted to a current by the pyroelectric peptide microtubule.

5. The flexible battery of claim 1, wherein heat energy that passes through the borophene sheet is converted to a current by the pyroelectric peptide microtubule.

6. The flexible battery of claim 1, further comprising a collection wire that directs the charge to the borophene capacitor.

7. The flexible battery of claim 6, wherein the borophene capacitor comprises:
   a first borophene plate;
   a second borophene plate; and
   a layer of insulating material located between the first borophene plate and the second borophene plate.

8. The flexible battery of claim 7, wherein the borophene capacitor further comprises an output.

9. The flexible battery of claim 6, further comprising:
   a further pyroelectric peptide microtubule, wherein the first end of the further pyroelectric peptide microtubule is located adjacent to the borophene sheet;
   a further borophene cap located at the second end of the further pyroelectric peptide microtubule, wherein the further borophene cap collects a further charge created by the further pyroelectric peptide microtubule; and
   a further collection wire that directs the further charge to the borophene capacitor.

10. The flexible battery of claim 1, further comprising an insulating ring located at the second end of the pyroelectric peptide microtubule.

11. The flexible battery of claim 1, further comprising a flexible structural housing having a plurality of borophene patches, a negative terminal, and a positive terminal.

12. A flexible battery comprising:
   a borophene sheet;
   an elastic sheet attached to the borophene sheet;
   a pyroelectric peptide microtubule, wherein a first end of the pyroelectric peptide microtubule is located adjacent to the elastic sheet;
   a borophene cap located at a second end of the pyroelectric peptide microtubule, wherein the borophene cap collects a charge created by the pyroelectric peptide microtubule, and wherein the charge is directed to a borophene capacitor; and
   an insulating ring located at the second end of the pyroelectric peptide microtubule, wherein the insulating ring is configured to reduce leakage of the charge from the pyroelectric peptide microtubule.

13. The flexible battery of claim 12, wherein movement of the elastic sheet provides mechanical energy that is converted to a current by the pyroelectric peptide microtubule.

14. The flexible battery of claim 12, wherein heat energy at the borophene sheet is converted to a current by the pyroelectric peptide microtubule.

15. The flexible battery of claim 12, further comprising a collection wire that directs the charge to the borophene capacitor.

16. The flexible battery of claim 15, further comprising:
- a further pyroelectric peptide microtubule, wherein the first end of the further pyroelectric peptide microtubule is located adjacent to the borophene sheet;
- a further borophene cap located at the second end of the further pyroelectric peptide microtubule, wherein the further borophene cap collects a further charge created by the further pyroelectric peptide microtubule; and
- a further collection wire that directs the further charge to the borophene capacitor.

17. The flexible battery of claim 12, wherein the borophene capacitor comprises:
- a first borophene plate;
- a second borophene plate; and
- a layer of insulating material located between the first borophene plate and the second borophene plate.

18. The flexible battery of claim 17, wherein the borophene capacitor further comprises an output.

19. The flexible battery of claim 12, further comprising a flexible structural housing having a plurality of borophene patches, a negative terminal, and a positive terminal.

20. A method comprising:
- connecting, by a flexible battery manufacturing device, a first side of a borophene sheet to an elastic sheet, wherein the borophene sheet has a thickness of one atom;
- connecting, by the flexible battery manufacturing device, a first end of a pyroelectric peptide microtubule to a second side of the borophene sheet; and
- connecting, by the flexible battery manufacturing device, a borophene cap to a second end of the pyroelectric peptide microtubule, wherein the borophene cap collects a charge generated by the pyroelectric peptide microtubule, wherein the charge is directed to a borophene capacitor.

* * * * *